(12) United States Patent
Kang et al.

(10) Patent No.: US 7,428,681 B2
(45) Date of Patent: Sep. 23, 2008

(54) METHOD AND APPARATUS FOR REDUCING NUMBER OF TRANSITIONS GENERATED BY LINEAR FEEDBACK SHIFT REGISTER

(75) Inventors: Sungho Kang, Seoul (KR); You-Bean Kim, Seoul (KR); Myung-Hoon Yang, Seoul (KR); Yong Lee, Seoul (KR)

(73) Assignee: Yonsei University, Seoul (KR)

( * ) Notice: Subject to any disclaimer, the term of this patent is extended or adjusted under 35 U.S.C. 154(b) by 223 days.

(21) Appl. No.: 11/159,025

(22) Filed: Jun. 22, 2005

(65) Prior Publication Data

US 2007/0011533 A1    Jan. 11, 2007

(30) Foreign Application Priority Data

May 27, 2005    (KR) .................... 10-2005-0045125

(51) Int. Cl.
*G01R 31/28* (2006.01)
*G06F 11/00* (2006.01)

(52) U.S. Cl. .................................... 714/738
(58) Field of Classification Search ............... None
See application file for complete search history.

(56) References Cited

U.S. PATENT DOCUMENTS

| | | | | |
|---|---|---|---|---|
| 5,576,738 A | * | 11/1996 | Anwyl et al. ............... 345/212 |
| 5,684,997 A | * | 11/1997 | Kau et al. .................... 710/260 |
| 5,907,238 A | * | 5/1999 | Owerko et al. .............. 323/349 |
| 6,816,990 B2 | * | 11/2004 | Song et al. ................... 714/729 |
| 2005/0134307 A1 | * | 6/2005 | Stojanovic et al. ........... 326/31 |
| 2005/0185479 A1 | * | 8/2005 | Berthold ................ 365/189.12 |
| 2005/0201491 A1 | * | 9/2005 | Wei ............................. 375/326 |
| 2005/0204220 A1 | * | 9/2005 | Yasuda et al. ............... 714/724 |
| 2005/0229062 A1 | * | 10/2005 | Volkerink et al. ........... 714/738 |

* cited by examiner

*Primary Examiner*—Jacques Louis-Jacques
*Assistant Examiner*—Guerrier Merant
(74) *Attorney, Agent, or Firm*—Jason Y. Pahng

(57) ABSTRACT

A method for reducing the number of transitions generated by an LFSR is introduced. The transition monitoring window monitors the number of transitions occurring as random patterns generated from an LFSR are applied to a scan chain, and, if the number of transitions exceeds a threshold value ("k-value"), all further transitions are suppressed. The transition monitoring window monitors the patterns entering the LFSR, incrementing a counter if a transition is detected. If a transition is detected just before the exit of a lowest stage of the LFSR the counter is decremented. The signal from the counter is compared with the k-value at every clock tick, and if the count is greater than the k-value, the vector most recently applied to the scan chain is re-applied to the scan chain; if it is less than the k-value, the output from the LFSR is applied to the scan chain.

5 Claims, 5 Drawing Sheets

|        | Average Pattern Transition | $\dfrac{(n-1)}{2}$ | Scan Inputs |
|--------|---------------------------|--------------------|-------------|
| s838   | 22.77                     | 15.5               | 32          |
| s1432  | 36.5                      | 36.5               | 74          |
| s9234  | 113.6                     | 113.5              | 228         |
| s13207 | 334.2                     | 334                | 669         |
| s38417 | 817.4                     | 817.5              | 1636        |
| s38584 | 725.3                     | 725.5              | 1452        |

Fig. 7a

| LFSR | 32 | | | | | | | |
|---|---|---|---|---|---|---|---|---|
| TMW | 16 | | | | | | | |
| k-value | 10 | | 9 | | 8 | | 7 | |
| | TR(%) | FG | TR(%) | FG | TR(%) | FG | TR(%) | FG |
| s5378 | 25.1 | + | 38.5 | = | 55.2 | = | 65.2 | − |
| s9234 | 25.3 | + | 42.9 | + | 61.4 | + | 77.7 | = |
| s13207 | 25.5 | = | 43.5 | = | 62.9 | = | 79.4 | − |
| s38417 | 26.4 | + | 43.7 | + | 63.3 | + | 78.3 | − |
| s38584 | 25.4 | = | 42.2 | = | 60.4 | = | 75.5 | − |

Fig. 7b

| LFSR | 24 | | | | | | | |
|---|---|---|---|---|---|---|---|---|
| TMW | 12 | | | | | | | |
| k-value | 8 | | 7 | | 6 | | 5 | |
| | TR(%) | FG | TR(%) | FG | TR(%) | FG | TR(%) | FG |
| s5378 | 22.5 | = | 40.7 | = | 55.3 | = | 78.5 | − |
| s9234 | 22.1 | + | 42.2 | + | 64.4 | + | 82.5 | = |
| s13207 | 23.2 | = | 42.5 | = | 62.4 | = | 80.6 | − |
| s38417 | 23.4 | + | 41.3 | + | 63.3 | + | 79.4 | = |
| s38584 | 22.3 | = | 40.6 | = | 62.2 | − | 77.2 | − |

Fig. 7c

| LFSR | 16 | | | | | | | |
|---|---|---|---|---|---|---|---|---|
| TMW | 8 | | | | | | | |
| k-value | 6 | | 5 | | 4 | | 3 | |
| | TR(%) | FG | TR(%) | FG | TR(%) | FG | TR(%) | FG |
| s5378 | 17.4 | + | 38.4 | = | 65.2 | = | 84.3 | − |
| s9234 | 17.5 | + | 41.1 | + | 68.5 | = | 88.5 | − |
| s13207 | 16.5 | = | 43.2 | = | 63.2 | = | 84.2 | − |
| s38417 | 19.2 | + | 44.5 | + | 63.2 | + | 85.1 | − |
| s38584 | 17.4 | = | 42.2 | = | 64.3 | = | 83.2 | − |

Fig. 8

| previous-work | | proposed scheme (when, α=1 in k-value) | | | | | |
|---|---|---|---|---|---|---|---|
| | | LFSR 32 / TMW 16 | | LFSR 24 / TMW 12 | | LFSR 16 / TMW 8 | |
| circuit | TR(%) | TR (%) | FG | TR (%) | FG | TR (%) | FG |
| s838 | 33.1 | 52.6 | + | 59.6 | + | 66.3 | = |
| s953 | 34.5 | 51.5 | + | 58.8 | + | 65.9 | + |
| s1196 | 20.4 | 48.5 | + | 55.8 | + | 64.3 | + |
| s1423 | 30.9 | 58.0 | = | 62.9 | = | 68.8 | = |
| s5378 | 27.0 | 55.2 | = | 55.3 | = | 65.2 | = |
| s9234 | 34.9 | 61.4 | = | 64.4 | + | 68.5 | = |

METHOD AND APPARATUS FOR REDUCING NUMBER OF TRANSITIONS GENERATED BY LINEAR FEEDBACK SHIFT REGISTER

BACKGROUND OF THE INVENTION

1. Field of the invention

The present invention relates to an improvement on LFSR (linear feedback shift register) used for BIST (built-in self-test).

2. Related Prior Art

BIST (built-in self-test) is typical of the "design for testability" techniques applicable especially to SoC (system-on-chip). It is considered the most appropriate choice for testing SoC. The most important advantage of BIST is that it does not use external testers, but uses test functions built into the individual chip, thus the test costs are reduced and testing is possible even during the manufacturing process or when in use. For performing BIST, entering test patterns is required. LFSR is commonly used to generate a pseudo-random pattern that is one type of test pattern.

Conventionally, referring to FIG. 1, an over-transition problem appears at scan chain 13, because of the low degree of association between the patterns generated in LFSR 10. To solve this problem, as shown in FIG. 1, the conventional circuit additionally includes a k-input AND gate 11 and a toggle flip-flop (T-FF) 12. FIG. 1 also shows block-wise a conventional structure of LT-RTPG (low transition random test pattern generator).

In FIG. 1, the number of inputs, "k," is determined by toggle probability. Empirical studies say the optimum value of k is 2 or 3. The LFSR 10 is connected to such inputs of the AND gate 11, and the T-FF 12 is operated according to the outputs of the AND gate 11, thereby patterns having high association are provided.

The T-FF 12 outputs "1" only if toggle occurs in the input values (i.e., when successive input vectors have different values; this is referred to as "transition"), while it outputs "0" otherwise. Therefore, in connection with the AND gate, by entering patterns having high association in the scan chain 13, a low power LFSR can be implemented. That is, in a k-input AND gate, the probability of generating "1" is $1/2^k$, and the transition occurs at the T-FF before and after this "1" generation. The scan chain shifts until the scan chain is filled with these test patterns. At this time, by applying test patterns having high association to the scan chain, the number of transitions can be reduced.

There was a test performed using the above conventional art, which used an ISCAS '89 benchmark circuit. The test result discloses that the scan transitions were reduced by about 30%. However, the test was performed only on circuits smaller than an s9234 circuit, and test results on a large scale circuit which had hundreds or thousands of scans could not be found. The reason for the absence of such test results is presumed to be that more patterns were required to find faults when varying the random patterns on the circuit shown in FIG. 1. Actually, in the above test result, it was noted that 131,072 test patterns were used to obtain 91.78% of the fault coverage.

In the conventional technique, although it comprises a k-input AND gate as well as a T flip-flop, its hardware overhead cannot be said to be very large. However, the inventors have studied a method to further reduce the scan transition numbers and to improve the fault coverage, thereby developing a new concept for a transition monitoring window and a novel low power LFSR structure by using the same.

SUMMARY OF INVENTION

According to a feature of the present invention, there is provided a method of reducing the number of transitions generated by an LFSR by using a transition monitoring window, comprising a transition monitoring window (hereinafter referred to as "TMW") which monitors the number of transitions occurring as random patterns generated from the LFSR are applied to a scan chain. If the number of transitions exceeds a threshold value (hereinafter, referred to as "k-value"), the vectors most recently entered in the scan chain are fed back, thereby reducing the number of transitions.

In the above, if the number of transitions within the TMW exceeds the k-value, the TMW re-applies to the scan chain the vector that was previously applied to the scan chain; if the number of transitions within the TMW does not exceed the k-value, the TMW applies the vector generated from the LFSR to the scan chain without any change.

The operation of the TMW consists of: monitoring for the occurrence of transition entering the LFSR; if the transition is detected, incrementing a counter by "1", otherwise, doing nothing; monitoring for the occurrence of transition just before the exit of a lowest stage of the LFSR; if the transition is detected, decrementing the counter by "1", otherwise, doing nothing; comparing a signal from the counter with the k-value at every clock tick; and if the monitored value is greater than the k-value, re-applying to the scan chain the vector most recently applied to the scan chain; if it is less than the k-value, applying to the scan chain the previously produced output from the LFSR.

In the present invention, it is desirable that the size of the TMW is half the size of the LFSR.

According to another feature of the present invention, there is provided a transition monitoring window comprising: a first XOR gate for monitoring for the occurrence of transition entered in the LFSR; a second XOR gate, connected to a lowest stage of the LFSR, for monitoring for the occurrence of transition just before the exit of the lowest stage of the LFSR; a counter, connected both to the first XOR gate and to the second XOR gate, to be incremented if the transition is detected; a comparator for comparing an output signal from the counter with the k-value at every clock tick; and a multiplexer for re-applying to the scan chain the vector most recently applied to the scan chain if the output from the counter is greater than the k-value, or if it is less than the k-value, applying to the scan chain the previously produced output from LFSR.

BRIEF DESCRIPTION OF THE DRAWINGS

The above and other objects, features, and advantages of the present invention will become more apparent from the following description when taken in conjunction with the accompanying drawings, in which:

FIGS. 7a-c are tables showing the experimental result that is obtained by varying the threshold transition number ("k-value") according to the size of LFSR.

FIG. 8 is a table showing the experimental result that is obtained by comparing the present invention and the conventional technique.

DETAILED DESCRIPTION OF THE PREFERRED EMBODIMENTS

Figure 1:
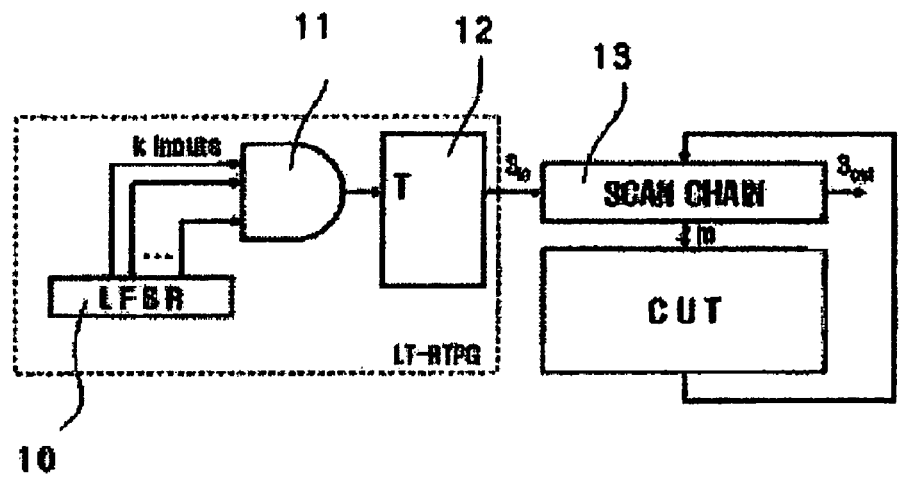
FIG. 1 is a block diagram of an LT-RTPG circuit using a conventional LFSR.
Figure 2:
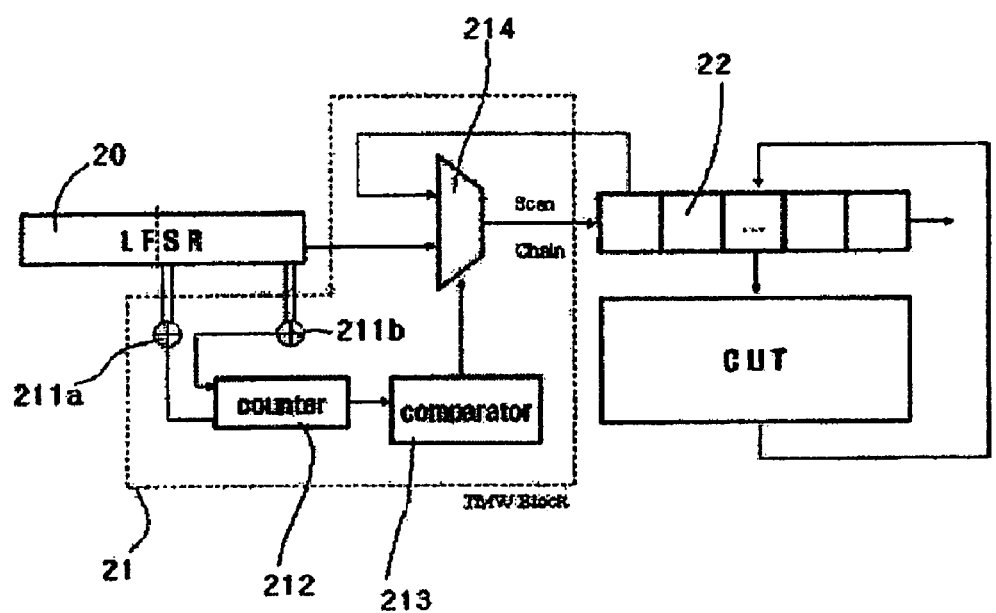
FIG. 2 is a block diagram of a structure of LFSR according to the present invention.

FIG. 2 shows a block diagram of the structure of LFSR using a "transition monitoring window" (TMW) according to the present invention. In operation, TMW block 21, which can be implemented by a combinational circuit, monitors the transitions occurring in LFSR 20. If the number of transitions is detected exceeding the "threshold transition number" (hereinafter, referred to as "k-value"), a multiplexer 214 feeds back the vector most recently entered in a scan chain 22 to make a highly associated vector, thereby reducing the number of scan transitions.

Figures 3, 4:
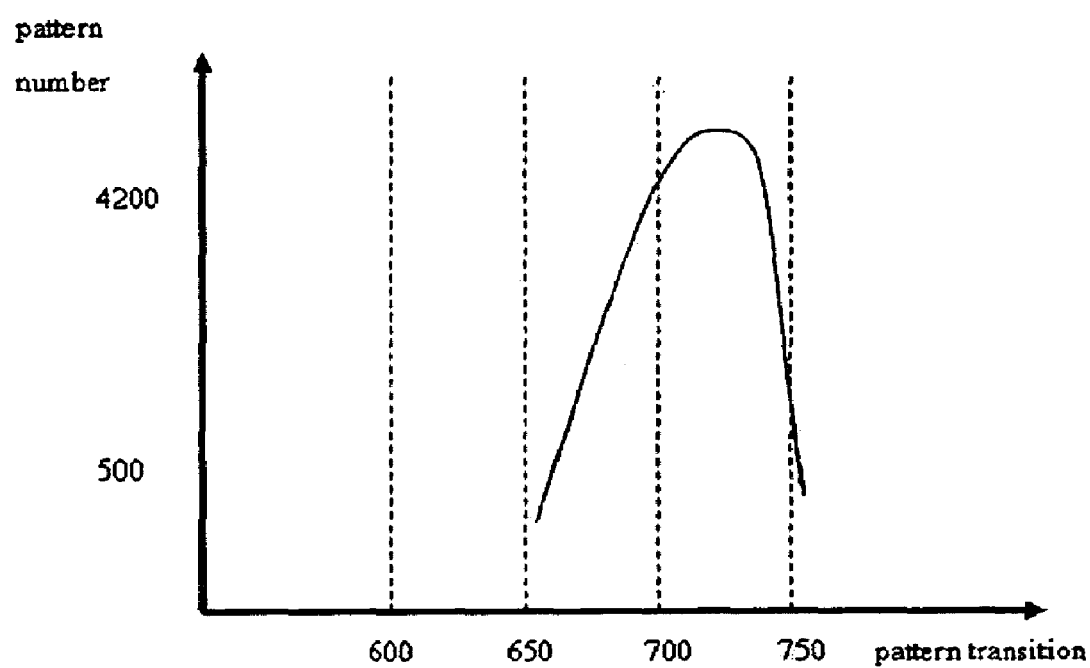
FIG. 3 is an exemplary view of the number of pattern transitions for the present invention.
FIG. 4 is a graph showing the distribution of pattern transitions of s13207.

The low power LFSR structure using a transition monitoring window according to the present invention is based on the fact that the transition numbers, occurring when random patterns generated from LFSR 20 are applied to the scan chain 22, constitute a quasi-Gaussian distribution. For example, as shown in FIG. 3, when a pattern P1 is fully applied to the scan chain 22, the pattern's transition number is seven (7) as the arrow indicates. The graph in FIG. 4 shows that pattern transition numbers of 5,000 patterns for s13207 constitute a quasi-Gaussian distribution. This attribute comes from the property of the random patterns generated from LFSR.

Figures 5, 6:
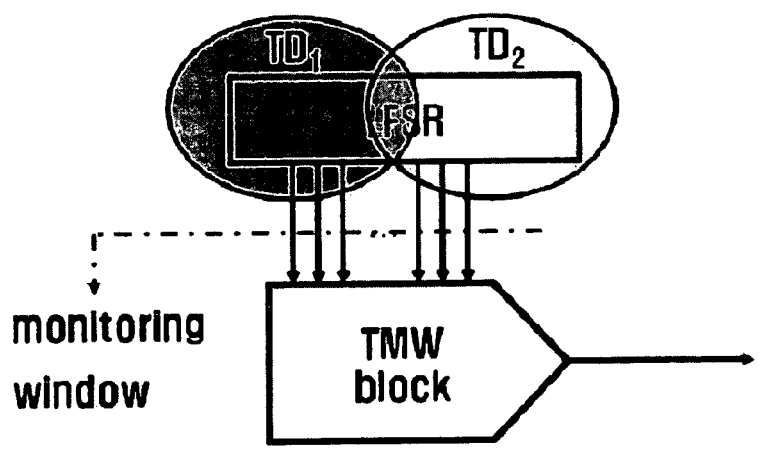
FIG. 5 is a graph for comparing the average number of pattern transitions with $(n-1)/2$.
FIG. 6 is a conceptual view explaining a transition monitoring window.

The average value of the pattern transition numbers comes close to $(n-1)/2$ which is the central axis of the distribution graph. FIG. 5 is a table that compares the average pattern transition numbers with $(n-1)/2$ for several exemplary circuits. Herein, "n" means the number of scan inputs.

It is a major feature of the present invention to reduce the number of scan transitions by allowing for a "k-value" which is measured by adding or subtracting a certain value to/from $(n-1)/2$, where the value $(n-1)/2$ is similar to the average number of pattern transitions generated from LFSR, and "n" stands for the size of LFSR.

At this time, an apparatus for monitoring whether the transition number reaches a predetermined "k-value" is required. TMW (transition monitoring window) block 21 is just such an apparatus. The concept of TMW is shown in FIG. 6. As shown, the size of the window is preferably set as small as possible. The reason for this is that, for the whole LFSR, if transition density TD2 is greater than TD1, a higher portion of the transition density is repressed, thereby obtaining a positive effect; on the contrary, if TD1 is greater than TD2, the low transition density TD2 is repressed by TD1, thus causing a negative effect. Thus it is desirable that the size of the transition monitoring window is set as small as possible.

The transition monitoring window is a new concept invented by the inventors. In the conventional art, a low power BIST is built by modifying or changing the output stage of LFSR, the inside of LFSR, or the inside of SCAN. While in the present invention, the tendency of LFSR to produce transitions is monitored in advance by the transition monitoring window, and thereafter the transition number is observed if it exceeds the predetermined k-value, i.e., all further transitions generated after reaching the k-value will be repressed. If the transition number within TMW exceeds the k-value, the signal is multiplexed and the vector that was previously applied to SCAN is re-applied to heighten the association between vectors, thereby producing low power patterns. If the transition number within TMW does not exceed the k-value, the vector generated in LFSR is applied without any change.

Hereafter, the operation of the present invention shown in FIG. 2 will be described in more detail, with reference to the above concepts. For easy understanding, the following description will be specified to a 32-bit LFSR. However, the scope of the present invention is not limited to this. In FIG. 2, the transition introduced from the LFSR to TMW, the size of which is half the LFSR, is monitored by XOR gate 211a. If the transition is detected, the XOR gate 211a increments the 4-bit counter by "1"; otherwise, it does nothing.

In the mean time, another XOR gate 211b is added at the lowest stage of TMW. This gate 211b detects the transition just before it exits the TMW. If the transition is detected, since it is a transition that will come out of the TMW, the gate 211b decrements the counter 212 by "1"; otherwise, it does nothing. The result of detection from the counter 212 is compared with the k-value of 8 by the comparator 213 at every clock tick. If the monitored value is greater than 8, the comparator 213 outputs "1" to the multiplexer 214. The multiplexer 214 MUXes this value and the vector most recently applied to SCAN 22 is again applied to SCAN 22. This re-applied vector is of high associativity, and therefore a low power LFSR can be implemented. If the comparator 213 does not output "1" due to the absence of a transition exceeding the k-value, there will be no further operation, therefore the previously produced output of LFSR is just applied to SCAN 22.

The inventors tried to experiment with adopting various sizes for the TMW, and after the experiment the inventors found that the optimum size of TMW was the half the LFSR. Reflecting this result, the k-value (i.e., the transition count after which all further transitions will be repressed) and the window size are determined by the following equations.

$$(k\text{-value}) = \frac{(\text{Monitoring Window Size}) - 1}{2} \pm \alpha$$

$$(\text{Monitoring Window Size}) = \frac{(LFSR \text{ size})}{2}$$

Here, $\alpha$ is an important parameter to determine the k-value, i.e., the transition count after which all further transitions will be repressed. Through the experiment, if $\alpha=+1$, the most optimum transition repression was achieved without loss in fault coverage. The result is shown in FIG. 7a to c. In FIG. 7a to c, TR means transition reduction rate, and FG means fault coverage gain, which shows how much loss arises by representing "+", "−", and "=". It is noted in FIG. 7 that about 60% reduction of scan transition occurred.

Comparing the present invention with the conventional technique, the compared results are shown in FIG. 8. This comparison experiment was done for small circuits in addition to the large circuits shown in FIG. 7, since the conventional technique was tested for circuits smaller than s9234 which was one of the benchmark circuits of ISCAS '89. The result shows that the method of the present invention can repress the transition about 30% more than the conventional technique, without loss of fault coverage.

In summary, the patterns applied in a test mode consume more electric power when in transition than in normal operation, since the former has low association compared to the latter, and so the transition density of the former is higher than the latter. If this unduly consumed power exceeds the range that a circuit can stand, fatal damage may result. To prevent this, a test requiring low power is considered. According to the present invention, the numbers of scan transitions are reduced about 30% more than the conventional techniques. In addition, it is. proved that there is no loss (i.e., in the aspect of fault coverage) comparing to the conventional techniques.

Thus far, while the invention has been shown and described with reference to certain embodiment to carry out this invention, it will be understood by those skilled in the art that various changes in form and details may be made therein without departing from the spirit and scope of the invention as defined by the appended claims.

What is claimed is:

1. A method of reducing the number of transitions generated by a linear feedback shift register (LFSR) by using a transition monitoring window (TMW), the method comprising:
   providing a transition monitoring window (hereinafter referred to as TMW),
   monitoring, by using the TMW, the number of transitions while random patterns generated from the LFSR are applied to a scan chain, wherein the size of the TMW is half the size of the LFSR, and
   feeding back, if the number of transitions exceeds a certain threshold transition number (hereinafter, referred to as k-value), the vectors most recently entered in the scan chain, thereby reducing the number of transitions, wherein the k-value is determined by $$(k\text{-value}) = \frac{(\text{Monitoring Window Size}) - 1}{2} \pm \alpha, \text{ where } \alpha \text{ is } 1.$$

2. The method of claim 1, wherein, if the number of transitions within the TMW exceeds the k-value, the TMW re-applies to the scan chain the vector that was previously applied to the scan chain; if the number of transitions within the TMW does not exceed the k-value, the TMW applies the vector generated from LFSR to the scan chain without any change.

3. The method of claim 1, wherein the TMW achieves the steps of:
   monitoring for the occurrence of transition entering the LFSR,
   if the transition is detected, incrementing a counter "1"; otherwise, doing nothing,
   monitoring for the occurrence of transition just before the exit of a lowest stage of the LFSR,
   if the transition is detected, decrementing the counter by "1"; otherwise, doing nothing,
   comparing a signal from the counter with the k-value at every clock tick, and
   if the monitored value is greater than the k-value, re-applying to the scan chain the vector most recently applied to the scan chain; if it is less tan the k-value, applying to the scan chain the previously produced output from the LFSR.

4. A transition monitoring window (TMW) for monitoring the number of transitions when random patterns generated from a linear feedback shift register (LFSR) are applied to a scan chain, and feeding back, if the number of transitions exceeds a threshold above which further transitions will be repressed (hereinafter, referred to as the "k-value), vectors most recently entered in the scan chain, thereby reducing the number of transitions, the transition monitoring window comprising:
   a first XOR gate for monitoring for the occurrence of transition entering the LFSR,
   a second XOR gate, connected to a lowest stage of the LFSR, for monitoring for the occurrence of transition just before the exit of the lowest stage of the LFSR,
   a counter, connected both to the first XOR gate and to the second XOR gate, to be incremented if a transition is detected,
   a comparator for comparing an output signal from the counter with the k-value at every clock tick, and
   a multiplexer for re-applying to the scan chain the vector most recently applied to the scan chain if the output from the counter is greater than the k-value; if it is less than the k-value, the previously produced output from LFSR is applied to the scan chain,
   wherein the size of the TMW is half the size of the LFSR and the k-value is determined by $$(k\text{-value}) = \frac{(\text{Monitoring Window Size}) - 1}{2} \pm \alpha, \text{ where } \alpha \text{ is } 1.$$

5. An apparatus of reducing the number of transitions by using the transition monitoring window (TMW) (as claimed in claim 4), the apparatus comprising:
   a linear feedback shift register (LFSR) for generating test vector signals,
   a scan chain for scanning the signals from the LFSR to a circuit under test,
   a first XOR gate for monitoring for the occurrence of transition entering the LFSR,
   a second XOR gate, connected to a lowest stage of the LFSR, for monitoring for the occurrence of transition just before the exit of the lowest stage of the LFSR,
   a counter, connected both to the first XOR gate and to the second XOR gate, to be incremented if a transition is detected,
   a comparator for comparing an output signal from the counter with the k-value at every clock tick, and
   a multiplexer for re-applying to the scan chain the vector most recently applied to the scan chain if the output from the counter is greater than the k-value; if it is less than the k-value, the previously produced output from LFSR is applied to the scan chain,
   wherein the size of the TMW is half the size of the LFSR and the k-value is determined by $$(k\text{-value}) = \frac{(\text{Monitoring Window Size}) - 1}{2} \pm \alpha, \text{ where } \alpha \text{ is } 1.$$

* * * * *